(12) United States Patent
Itoh et al.

(10) Patent No.: US 7,547,412 B2
(45) Date of Patent: Jun. 16, 2009

(54) COMPOSITE MATERIAL, METHOD FOR PRODUCING SAME AND MEMBER USING SAME

(75) Inventors: Masayuki Itoh, Tokyo (JP); Tadashi Arikawa, Tokyo (JP); Norio Hirayama, Tokyo (JP); Yoshinari Amano, Tokyo (JP); Nobuyuki Saitoh, Tokyo (JP)

(73) Assignee: A.L.M.T. Corporation, Tokyo (JP)

( * ) Notice: Subject to any disclaimer, the term of this patent is extended or adjusted under 35 U.S.C. 154(b) by 500 days.

(21) Appl. No.: 10/533,087

(22) PCT Filed: Oct. 28, 2003

(86) PCT No.: PCT/JP03/13779

§ 371 (c)(1),
(2), (4) Date: Apr. 28, 2005

(87) PCT Pub. No.: WO2004/038049

PCT Pub. Date: May 6, 2004

(65) Prior Publication Data

US 2005/0287387 A1    Dec. 29, 2005

(30) Foreign Application Priority Data

Oct. 28, 2002  (JP) .............................. 2002-312130

(51) Int. Cl.
*C22C 27/04* (2006.01)
*B22F 7/02* (2006.01)
*H01L 29/12* (2006.01)
*H01L 21/00* (2006.01)

(52) U.S. Cl. .................. 420/429; 428/548; 428/620; 438/122

(58) Field of Classification Search ................ 420/429; 438/122; 428/548, 620
See application file for complete search history.

(56) References Cited

U.S. PATENT DOCUMENTS

| 4,640,999 | A | * | 2/1987 | Kashiwagi et al. ........... 218/130 |
| 4,661,666 | A | * | 4/1987 | Sakuma et al. ............... 218/129 |
| 5,167,697 | A | | 12/1992 | Koumura |
| 6,239,514 | B1 | * | 5/2001 | Isberg et al. ................. 307/116 |
| 2002/0017346 | A1 | | 2/2002 | Osada et al. |

FOREIGN PATENT DOCUMENTS

| JP | 5-171222 A | 7/1993 |
| JP | 6-310620 A | 11/1994 |
| JP | 7-105464 A | 11/1995 |
| JP | 10-12767 A | 1/1998 |
| JP | 2000-323632 A | 11/2000 |
| JP | 2001-358266 A | 12/2001 |

* cited by examiner

*Primary Examiner*—John P. Sheehan
*Assistant Examiner*—Jessee R. Roe
(74) *Attorney, Agent, or Firm*—Sughrue Mion, PLLC (57) ABSTRACT

A composite material is a Mo—Cu based composite material having a Cu content of 30 to 70 weight % and containing a copper pool phase and an Mo—Cu based composite phase. The copper pool phase is contained in an amount of 10-50 weight %. A heat-sink member uses the composite material.

7 Claims, 6 Drawing Sheets

OPTICAL MICROGRAPH × 50

COMPOSITE MATERIAL, METHOD FOR PRODUCING SAME AND MEMBER USING SAME

TECHNICAL FIELD

The present invention relates to a Mo—Cu based composite material and a member using the same.

BACKGROUND ART

Mo and Cu (which may be referred to as copper hereinafter) are not dissolved into each other in a solid state. Therefore, a Mo—Cu based material generally is a composite material obtained by mixing and bonding these components together. Accordingly, this material is a functional material having functions of Mo and Cu in combination. By selecting the content ratio of these components and a microscopic or a microscopic arrangement design, it is possible to provide members having various functions and various functional levels.

The above-mentioned material is roughly classified into a material in which Mo and Cu particles are microscopically substantially uniformly distributed (type 1), a material in which Mo and Co are macroscopically bonded to each other (type 2), and a material comprising a combination of these types or having an intermediate arrangement therebetween (type 3).

The type 1 is a Mo—Cu based composite material in a narrow sense. The type 2 includes a material comprising a laminated structure of Cu and Mo, such as CMC (registered trademark) obtained by adhering Cu, Mo and Cu plates in this order, and a material in which Mo and Cu are macroscopically unevenly arranged. The type 3 is a mixture of these types.

The terms "Mo—Cu sintered alloy" and "Mo—Cu alloy phase" in the specification of Japanese Patent Application No. 2002-312130 which is a basis of the present application correspond to the above-mentioned original microscopic structure. In the present application, these terms are replaced by synonymous terms "Mo—Cu based composite material" and "Mo—Cu based composite phase", respectively.

Hitherto, the above-mentioned material has been used mainly in a heat-sink member for releasing or radiating heat of an electrical or an electronic equipment, in particular, in a heat-sink member of a semiconductor apparatus. Since this material has the above-mentioned functions, it is possible to utilize advantageous properties of Mo and Cu, suppress disadvantageous properties thereof, and complement each other. Therefore, depending upon its material design, a number of applications are found. For example, it is conceivable to apply the material to a structural member if the rigidity of Mo and the ductility of Cu are utilized, to a member for a special radiation apparatus if radiation-resistant properties of Mo and Cu are utilized, to a heat-resistant electrical or electronic member, such as an electric contact and a discharge-machining or a welding electrode, if the heat resistance of Mo and the electroconductivity of Cu are utilized, and to a member for a chemical apparatus if chemical properties of Mo and Cu are utilized.

As regards the Mo—Cu based composite material suitable for the heat-sink member, particularly, to be mounted to a semiconductor device, Japanese Patent Publication (JP-B) No. H7-105464 (hereinafter referred to as a reference document 1) discloses an unrolled material of the type 1. Japanese Unexamined Patent Application Publications (JP-A) Nos. H6-310620 (hereinafter referred to as a reference document 2) and 2001-358266 (hereinafter referred to as a reference document 3) disclose a rolled material of the type 1. Japanese Patent (JP-B) No. 2000-323632 (hereinafter referred to as a reference document 4) discloses a material of the type 2 comprising Mo, Cu and Mo laminated in this order. Japanese Unexamined Patent Application Publication (JP-A) No. H10-12767 (hereinafter referred to as a reference document 5) discloses a material of the type 2 comprising Cu, Mo and Cu laminated in this order and another material of the type 3 comprising a Mo—Cu based composite material layer combined therewith.

As is well known, the material intended for the above-mentioned application or use is mainly required to have a high thermal conductivity during practical use and to be matched in thermal expansion coefficient with the semiconductor device and a peripheral member at the periphery of a mounting area of the semiconductor device (hereinafter referred to as an envelope member) during practical use and at the time of mounting. In the future, following a rapid increase in degree of integration of the semiconductor device, development of miniaturization of a large-capacity package, development of an increase in capacity of a rectifier of an electrical apparatus, and so on, it is expected that heat load on a member mounted to a package will rapidly increase. Accordingly, the heat-sink member is required to have a yet higher thermal conductivity. For example, in case where the semiconductor device is made of Si and the envelope member is made of AlN, the thermal expansion coefficients thereof are both small and close to that of Mo. In this event, it is difficult to increase the thermal conductivity and to achieve matching in thermal expansion coefficient only by adjusting the composition ratio of the whole of the Mo—Cu based composite material.

The materials disclosed in the reference documents 4 and 5 are well designed, for example, improved in lamination design of Mo and Cu and a connecting surface connected to a mating or counterpart member in order to achieve matching in thermal expansion coefficient with the mating member at the time of mounting and during practical use. However, because of a clad structure, interlayer thermal stress tends to be generated so that some deformation is inevitable in case where a high thermal load is applied at the time of mounting and during practical use.

The reference document 1 discloses the material which contains Mo and Cu substantially uniformly distributed microscopically in three-dimensional directions and which comprises a Mo—Cu based composite phase as a whole. A plastic-deformed material obtained by plastic deformation of the above-mentioned material is disclosed in the reference document 2. In the plastic-deformed material, component particles are stretch-oriented in a plastic-deformation direction, as described in the document. It is stated that, as compared with the material of the reference document 1 containing the same Cu amount, the thermal conductivity is substantially equivalent and the thermal expansion coefficient is lowered by about $1 \times 10^{-6}/°$ C. In this case, however, it is supposed that the thermal conductivity is equivalent to that in the reference document 1 in the plastic-deformation direction but is slightly lowered in a thickness direction. This also applies to the material in the reference document 3. As described above, the Mo—Cu based composite material is increased in thermal conductivity and thermal expansion coefficient in proportion to the Cu amount. Accordingly, there is a limit in increasing the thermal conductivity while suppressing the thermal expansion coefficient. Further, in the plastic-deformed material, these thermal characteristics exhibit directivity. It is therefore necessary to proceed with the material design also based on such directivity.

In the foregoing, the tendency of the conventional material design of the Mo—Cu based composite material has been reviewed in conjunction with the heat-sink member for the semiconductor apparatus by way of example. In case where development towards other applications is sought utilizing other functions of this material, it is also necessary to overcome the problem with the same concept. Specifically, if this material is used for a certain application, it is desired to achieve a novel material design such that advantageous functions of Cu and Mo as main components are utilized while disadvantageous functions thereof are suppressed or such that these components can be complemented by each other.

In view of the above, it is a first object of the present invention to provide composite materials of the type 1 and the type 2, capable of achieving a high thermal conductivity and matching in thermal expansion coefficient with an envelope member.

It is a second object of the invention to provide a composite material for a heat-sink member, considering heat-radiation properties after plastic deformation.

It is a third object of the invention to provide a composite material which can be matched in thermal expansion coefficient with Si and GaAs of a semiconductor device and various packaging materials, in particular, alumina and AlN and which is low in cost and has a high thermal conductivity adapted to a higher degree of integration and a lighter weight.

It is a fourth object of the invention to provide a heat-sink member using the above-mentioned composite material.

It is a fifth object of the invention to provide a method of producing the above-mentioned composite material.

It is a sixth object of the invention to provide a semiconductor apparatus in which the above-mentioned heat-sink member is used for heat radiation of a semiconductor apparatus, for example, in a heat-radiating substrate.

DISCLOSURE OF THE INVENTION

In order to attain the above-mentioned objects, a composite material according to the present invention is a Mo—Cu based composite material having a Cu content of 30 to 70 weight % and comprising at least one copper pool phase and a Mo—Cu based composite phase, the copper pool phase being contained in an amount of 10 to 50 weight %.

In the present invention, it is preferable that the at least one copper pool phase has an average short diameter of 50 to 200 μm and that the composite material is subjected to plastic deformation.

A member or a heat-sink member according to the present invention uses the composite material described above.

A semiconductor apparatus according to the present invention uses the heat-sink member described above.

A method of producing a composite material according to the present invention comprises the step of compressing a matrix of Mo powder and a copper-based material having an average short diameter of 50 μm or more and arranged in the matrix to obtain a compressed body and, optionally, sintering the compressed body to obtain a pre-sintered body, and the step of infiltrating copper or a copper alloy into the compressed body or the pre-sintered body to produce a composite material having a Cu content of 30 to 70 weight % and containing 10-50 weight % of at least one copper pool phase.

In the method of producing a composite material according to the present invention, it is preferable that the copper-based material is powder which has an average short diameter of 50 to 200 μm and which is mixed with the Mo powder before the above-mentioned compressing step.

BRIEF DESCRIPTION OF THE DRAWINGS

FIG. 1 (a) is a view which schematically illustrates a metallographic structure of a composite material of the present invention when a copper-based material is arranged and then compressed;

FIG. 1 (b) is a view which schematically illustrates the metallographic structure of the composite material in FIG. 1 (a) when copper is infiltrated and then pool phases are formed;

FIG. 7 (a) is a view which schematically illustrates, in a microscopic viewing field, an example of an arrangement pattern of the copper pool phases and a Mo—Cu based composite phase of the composite material of the present invention in case where the copper pool phases of a plurality of different sizes are microscopically mixed;

FIG. 7 (b) and FIG. 7 (c) are views which illustrate examples of a case where the copper pool phases of the composite material of the present invention are arranged in a functionally gradient design;

FIG. 7 (d) is a view which illustrates, in a microscopic viewing field, a case where the copper pool phases of the composite material of the present invention have a spindle-like shape and arranged in random directions;

FIG. 7 (e) is a view which illustrates, in a macroscopic viewing field, a member composed of three layers different in arrangement density of the copper pool phases of the composite material of the present invention;

FIG. 7 (f) is a schematic view which illustrates, in a macroscopic viewing field, another example of the arrangement pattern of the composite material of the present invention;

FIG. 7 (g) is a conceptual perspective view showing a case where rod-like copper pool phases are oriented in a longitudinal direction of a rod-like member made of the composite material of the present invention.

BEST MODES FOR EMBODYING THE INVENTION

Now, the present invention will be described along a production process.

First, a copper-based material having an average short diameter of 50 μm or more is arranged in a Mo matrix and, in this state, they are compressed together. The component of the copper-based material may be pure copper, a copper-based alloy mainly containing copper, or a material comprising copper or the copper-based alloy and a small amount of a secondary component added thereto. The component of the copper-based material is selected depending upon an end use. For example, for use in a member with importance placed on original functions of copper, such as thermal conductivity and electrical conductivity, it is desired to use a high-purity material, such as pure copper or electrolytic copper. For example, for use in a mechanical member or the like, it is desired to select a copper alloy having a high toughness as required. Individual units of the copper-based material arranged in the matrix are finally melted into copper pool phases. It is therefore desired that external dimensions thereof are preliminarily approximated to desired final external dimensions, that the shape thereof and the arrangement pattern thereof in the matrix after compressing are approximated to a desired final morphology of the composite material, and that these conditions are substantially maintained.

When the copper-based material is arranged in the Mo matrix, it is desired to arrange the material at predetermined positions by use of a tool so as to minimize deformation or to uniformly disperse and arrange the material by the use of a mixer, such as a V type mixer, having no milling function.

The amount of the copper-based material arranged so as to effectively utilize the function of the copper pool phases is generally within the range of 10 to 50 weight %. This is because, if the amount is less than 10 weight %, the effect of the copper pool phases for controlling thermal, electrical and mechanical performances, which will later be detailed, is reduced. On the other hand, if the amount is more than 50 weight %, the function approaches to that of copper so that original features of the composite material are impaired. It is noted here that a compressed body or a pre-sintered body obtained by sintering (may be referred to as pre-sintering) the compressed body tend to contract because copper is contained. Therefore, depending on conditions of the molding and the pre-sintering, the porosity thereof may be varied in some degree or the amount of the arranged copper-based material in the composite material may slightly be shifted although within the above-mentioned range.

Figure 1:
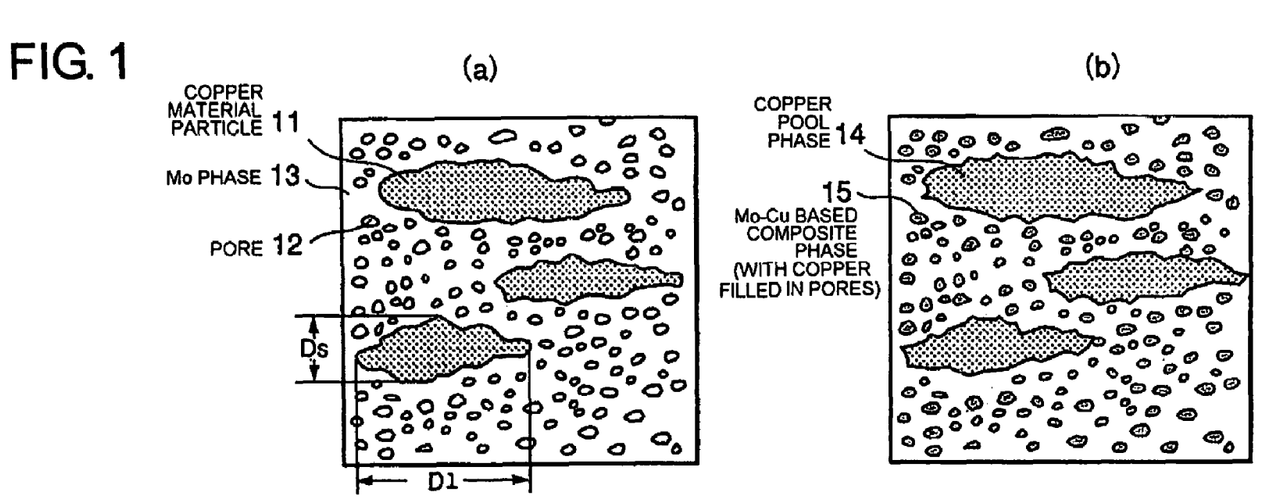
Figure 2:
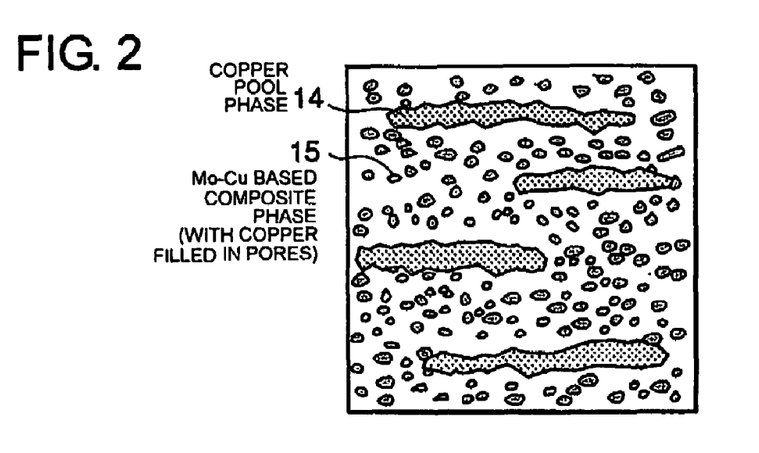
FIG. 2 is a view which schematically illustrates the metallographic structure when the material in FIG. 1 (b) is subjected to plastic deformation.

Each of FIG. 1 (*a*), FIG. 1 (*b*) and FIG. 2 is a view which schematically illustrates an example of a morphology of a microscopic arrangement. FIG. 1 (*a*) shows a morphology when the copper-based material is arranged and then compressed and FIG. 1 (*b*) shows a morphology of the same portion in the same view when pool phases are formed after infiltration of copper. FIGS. 1 (*a*) and 1 (*b*) show a case where no plastic deformation is performed. FIG. 2 shows a case where plastic deformation is performed by rolling or the like.

In FIG. 1 (*a*), large particles are made of the copper-based material preliminarily mixed. In FIG. 1 (*b*), these portions are turned into the copper pool phases.

A Mo phase as a matrix in FIG. 1 (*a*) is turned into a Mo—Cu based composite phase after infiltration by filling the copper-based material into pores of the matrix as illustrated in FIG. 1 (*b*). The morphology of a microscopic structure of the Mo—Cu based composite phase can easily be changed by selecting the size or the shape of the Mo particles as a starting material, producing conditions upon molding and in subsequent steps, and so on. For example, if the porosity or the pore morphology of the compressed body or the pre-sintered body is controlled by changing the particle size distribution of the Mo particles or by preliminarily mixing fine powder and coarse powder at an appropriate ratio, it is possible to control the amount, the size, and the distribution pattern of copper after infiltration. Therefore, the function of the matrix of the composite material can also be controlled.

A main object of the present invention is to control the functions of the composite material by formation of the copper pool phases. As described above, however, the matrix also has a factor capable of controlling the functions of the composite material of the present invention. In this case, the short diameter of the copper-based material indicates a portion $D_s$ in FIG. 1. The short diameter of the copper pool phases in FIG. 1 (*b*) also corresponds to that portion.

In case where the copper-based material constitutes secondary particles formed by aggregation of primary particles, the short diameter $D_s$ is calculated from an external shape of the aggregation. As illustrated in FIG. 1 (*a*) and FIG. 2, a portion having a maximum external shape is defined by a long diameter $D_l$. Another portion having a maximum width in a direction perpendicular to the long diameter is defined as the short diameter $D_s$. If the external shape is fibrous, the length thereof is the long diameter $D_l$ and the maximum diameter is the short diameter $D_s$. If the external shape is a plate-like shape, a portion having the maximum length in the plane direction is defined as the long diameter $D_l$ and another portion perpendicular thereto and having the maximum thickness is defined as the short diameter $D_s$. Even if the external shape is an irregular shape or a hollow shape, these dimensions are decided based on the same concept. The average short diameter is set to 50 μm or more because, if the copper-based material is distributed in a size less than 50 μm, the effect of forming the pool phases in the composite material becomes small. The existence form thereof is observed by an optical microscope in a view within any desired cross section and analyzed as two-dimensional patterns illustrated in FIG. 1 (*a*), FIG. 1 (*b*), and FIG. 2. In case of the copper pool phases, any desired cross section of the composite material is photographed by the use of an optical microscope in several tens to several hundreds magnifications. In case where the composite material is subjected to plastic deformation, a cross section perpendicular to a working direction is photographed. Next, all of the pool phases photographed in the view are analyzed unit by unit to individually measure dimensions corresponding to the long diameter and the short diameter. The average thereof is an arithmetic average.

It is desirable to use, as the copper material as a starting material, a material having an average short diameter of 200 μm or less. If the average short diameter exceeds 200 μm, variation in functions of the composite material, resulting from the copper pool phases, becomes large. The average particle size of the Mo powder may be an ordinary size on the order to several micrometers. However, the Mo powder having the average particle size smaller than 1 μm is expensive. On the other hand, If the average particle size is greater than 10 μm, variation in functions, such as thermal properties, electrical properties, and mechanical properties, becomes large. Therefore, the average particle size is preferably in the range of 1 to 10 μm.

Of course, if it is desired to control the microscopic structure of the Mo—Cu based composite material, the size and the distribution thereof may appropriately be selected. The average particle size of any powder in the present invention is a secondary particle size measured and calculated by the Fischer Sub-Sieve Sizer (FSSS) method. However, in case of the copper pool phases, the long diameter and the short diameter are used in combination as outer dimensions thereof as described above. Preferably, the purity of each of the Cu and Mo powders is as high as possible although depending upon the intended use or application of the composite material. Generally, 99% or more is sufficient.

The molding after the copper material is arranged in the Mo matrix may be performed by an ordinary method, which is selected in accordance with a final shape and the existence form which are suitable for the intended use. For example, powder press molding, isostatic molding, extrusion molding, injection molding, and doctor blade method are known. In case where pressure is applied, the pressure is adjusted to adjust the porosity of the compressed body. In case where an organic or an inorganic binder is added for the molding, the binder is mixed in advance. At this time, the kind and the added amount of the binder affect the porosity of the compressed body or the pre-sintered body before infiltration, and consequently affect the amount of Cu in the composite phase and in the whole of the composite material. Therefore, it is necessary to adjust various conditions including conditions for heating/removing the binder in a non-oxidizing gas atmosphere after the molding and conditions for sintering performed to control the porosity.

In case where compression is insufficient at the time of the molding so that the porosity is large beyond a desired range, whether the binder is added or not, the compressed body is subjected to sintering (may be referred to as pre-sintering) at 800 to 1400° C. in a reducing gas atmosphere to thereby contract the compressed body into a pre-sintered body. In this manner, a desired porosity is assured. Furthermore, this also improves an easiness in handling. Since the compressed body or the pre-sintered body contains Cu or a Cu alloy as its substitute in advance, contraction starts even at a temperature not higher than the melting point thereof. Therefore, sintering is desirably carried out at a sintering temperature within the range of 1100 to 1300° C. in order to suppress the contraction during sintering and resultant deformation. Preferably, the reducing gas is a hydrogen-containing gas. As described above, the compressed body or the pre-sintered body having a desired porosity is prepared. A target value $\rho$ (%) of the porosity in the production is calculated by the formula: $(W-W_0)100\rho$ where W (%) represents a desired weight ratio of Cu in the composite material, $W_0$ (%) represents the weight ratio of Cu of the copper-based material initially arranged in the compressed body, and $\rho$ (g/cm$^3$) represents the density of the infiltrated copper or copper alloy. When the copper material is different from the infiltrated copper or copper alloy, the target porosity is calculated by the formula: $(W/\rho-W_0/\rho_0)/100$ where $\rho_0$ and $\rho$ represent the density of the former and the density of the latter, respectively.

Next, copper or the copper alloy is infiltrated into the pores in the compressed body or the pre-sintered body to thereby obtain a Mo—Cu based composite material having a Cu content of 30 to 70 weight % and a Cu pool phase content of 10 to 50 weight %. In the present invention, the copper content is a net amount of copper in the composite material. If the initially arranged copper-based material or the infiltrated material is not pure copper, the copper content is smaller than the total amount of these materials. On the other hand, the content of the copper pool phases is represented by the weight ratio of the copper pool phases regardless of the material of the copper phases in the infiltrated body. The infiltration is performed in a reducing gas atmosphere in the temperature range from the melting point of Cu or the Cu alloy to 1400° C. Preferably, the atmospheric gas is a hydrogen-containing gas. The temperature range is preferably from 1150 to 1300° C. This is because, in the above-mentioned temperature range, melted Cu or the Cu alloy is sufficiently infiltrated into the pores. The above-mentioned process is a basic process for producing the composite material of the present invention.

The process for producing the composite material of the present invention further includes the case where the infiltrated body is subjected to plastic deformation. For the plastic deformation, an ordinary method, such as hot, warm, or cold rolling/forging/extrusion/hot press, is used depending upon the final shape. At this time, plastic-deformation conditions, such as the working temperature, the atmosphere, and the degree of plastic deformation, are adjusted considering the morphology of the final plastic-deformed body, which is desired for a member to be obtained. This plastic deformation makes it possible to achieve a dense structure and, if the infiltrated body has voids, to reduce the amount of voids. Depending upon the working conditions, stretch-orientation of the micro-structure may occur so that the directivity is imparted to the functions of the material. Herein, the initial shape means the initial dimension in the direction of compression by the plastic deformation (for example, the initial thickness) while the shape after the working means the dimension in the same direction after the plastic deformation (for example, the thickness after the working).

The degree of plastic deformation in the present invention is given by: [Worked Amount]/[Initial Shape]×100% (where [Worked Amount]=[Initial Shape]−[Shape after Working]). Furthermore, simultaneously with the plastic deformation, the composite material of the present invention may be united or combined with another member or part, such as metal ceramics. Alternatively, the infiltrated body or the plastic-deformed body may be subjected to cold, hot, or warm plastic deformation and, simultaneously, united or combined with a metal or an organic material such as plastic. In the above-mentioned manner, it possible to obtain a member having a wider variety of functions and a higher added value.

The composite material of the present invention may be obtained by a method including the above-mentioned steps. If necessary, another step such as bonding or heat treatment may be added to the above-mentioned basic steps.

Figure 3:
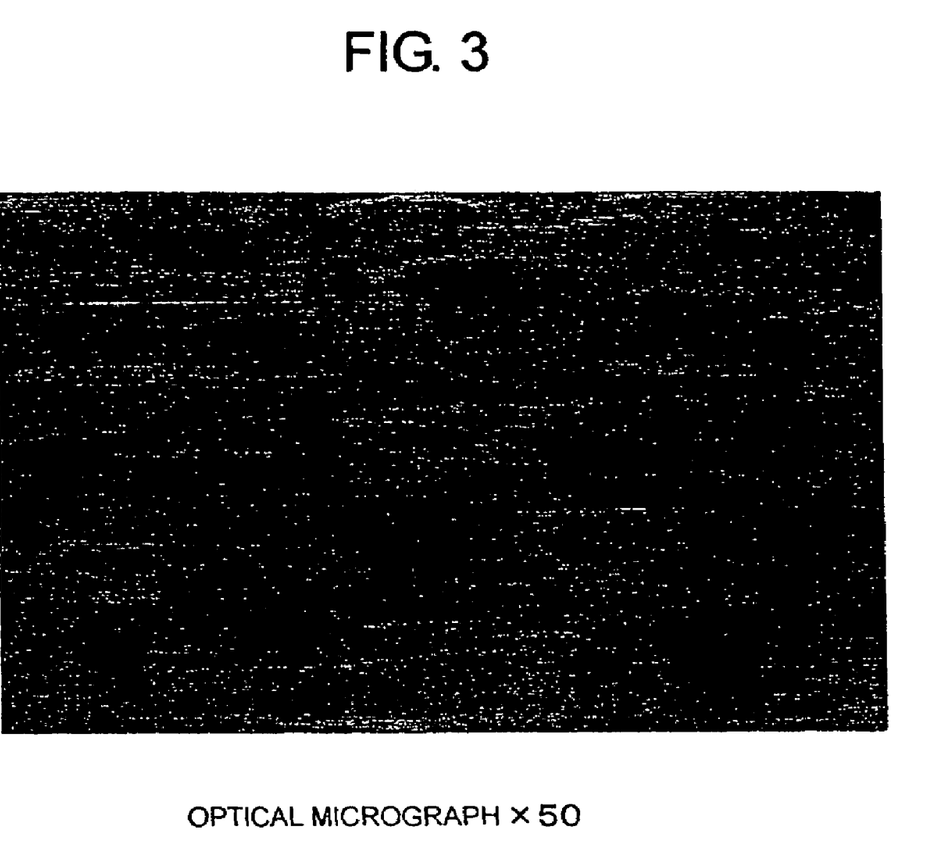
FIG. 3 is an optical micrograph showing one example of the metallographic structure of the composite material of the present invention.

FIG. 3 is a view illustrating one example of the micro-structure of the composite material of the present invention obtained as mentioned above. The illustrated example is plastic-deformed by hot rolling. As shown, the material comprises the micro-structure in which copper pool phases and a Mo—Cu based composite phase are mixed. In FIG. 3, light-colored stretched portions correspond to the copper pool phases while a remaining dark-colored portion corresponds to the Mo—Cu based composite phase. The amount of copper in the composite material of the present invention is within the range from 30 to 70 weight %, including the copper pool phases, with respect to a whole of the composite material. This is because, if the amount is less than 30 weight %, features of Mo are prominently exhibited and the workability upon plastic deformation is lowered. On the other hand, if the amount exceeds 70 weight %, the-effect of hybridization utilizing the features of Mo and Cu is lowered even if the copper pool phases are formed. Depending upon the intended use, the amount of Cu is controlled within the above-mentioned range. For example, if the composite material is used as a heat-sink member of a semiconductor apparatus, the amount is preferably within a range from 40 to 60 weight % in order to match the thermal expansion coefficient with a GaAs semiconductor device and an alumina envelope member.

The amount of the copper pool phases is 10 to 50 weight % with respect to a whole of the composite material. This is because, if the amount is less than 10 weight %, the effect of controlling the thermal, the electrical, or the mechanical property by forming the copper pool phases, which will later be described, is lowered. On the other hand, if the amount exceeds 50 weight %, the function of the material is near to the function of Cu and original features of the composite material are less distinct. The average short diameter thereof is preferably within the range of 50 to 200 μm. If the average short diameter is less than the lower limit, the above-mentioned effect may be lowered for the reason same as that described above. If the average short diameter exceeds the upper limit, the homogeneity of the function of the composite material may be impaired. The size and the amount of the copper pool phases are controlled within the above-mentioned range and properly designed depending upon the copper amount in the whole composite material or the functional application for which the material is intended. Between the composite materials subjected to and not subjected to plastic deformation, proper ranges may be different even if the intended use or application is same. For example, as the heat-sink member of the semiconductor apparatus, in order to match the thermal expansion coefficient with a GaAs semiconductor device and an alumina envelope member as described above, it is desired to control the Cu amount in the whole composite material into the range of 40 to 60 weight % as described above. Further, in case where the thermal conductivity is simultaneously regarded important and the demand for increasing the thermal conductivity must be met, the amount of the copper pool phases is desirably within the range of 25 to 45 weight %. However, in case where the material rolled into a plate-like shape is used for the same application and needs and heat radiation is mainly effected in the thickness direction, the amount of the copper pool phases must be slightly greater as compared with the case where heat radiation is effected in the plane direction perpendicular to the thickness direction.

Figure 4:
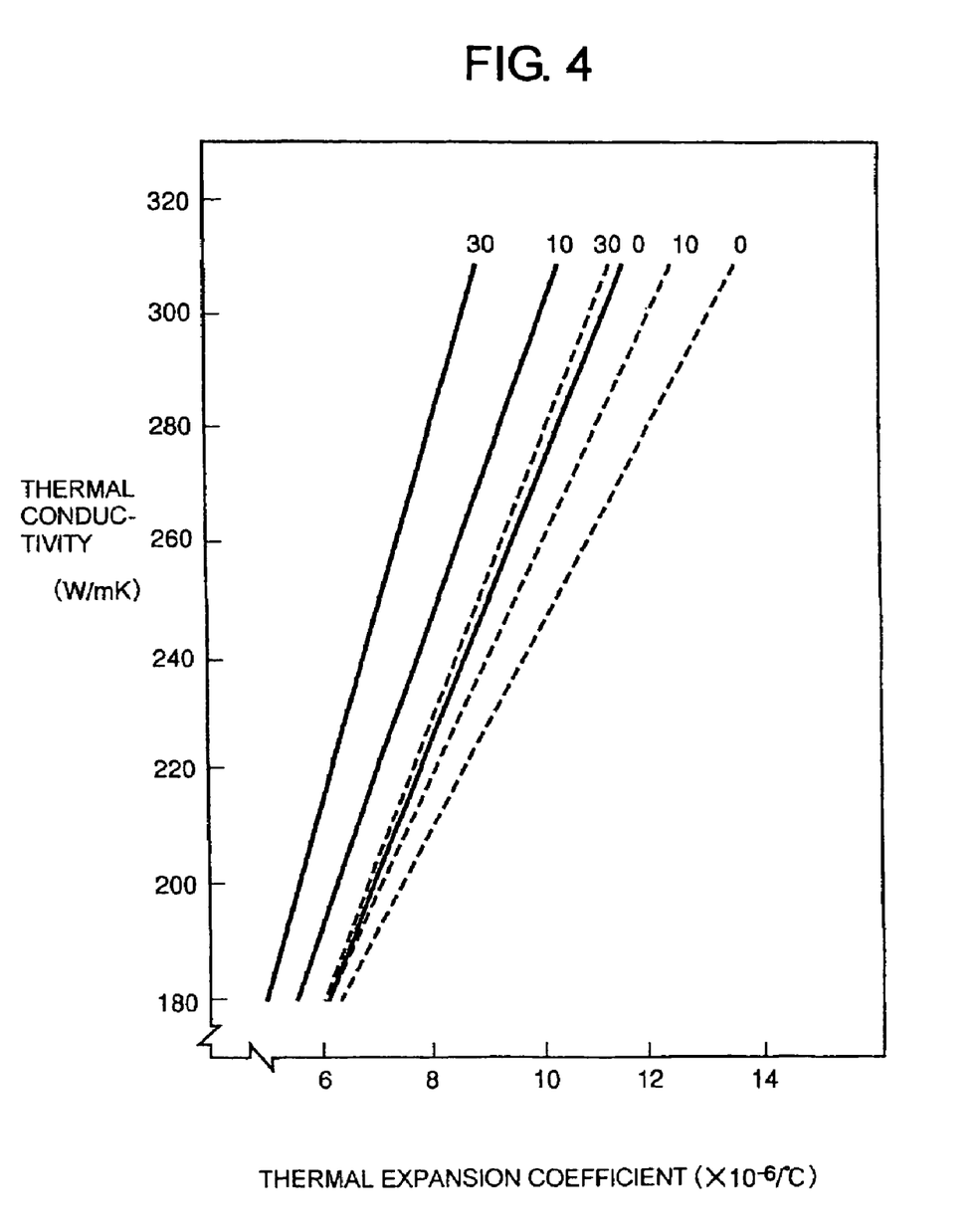
FIG. 4 is a view showing the relationship between the thermal conductivity and the thermal expansion coefficient of the composite material of the present invention when the copper amount is changed.

Referring to FIG. 4, numerical values 0, 10 and 30 at top ends of six lines represent the amounts (weight %) of the copper pool phases. Three dotted lines represent the cases where no plastic deformation is conducted while three solid lines represent the cases where plastic deformation is conducted by hot rolling at the deformation degree of 90%. Although not clearly specified in FIG. 4, the copper amount is increased rightward along each line. The thermal conductivity in the present invention is a value measured by the laser flash method for a plate-like test piece in the thickness direction. In case where no plastic deformation is conducted, the test piece is cut off from any desired portion of the raw material. In case where the plastic deformation is conducted, the test piece is cut off so that the direction perpendicular to the plastic-deformation direction of the raw material is coincident with the thickness direction of the test piece.

The test pieces without the copper pool phases in FIG. 4 comprise only of a Mo—Cu based composite phase with infiltrated copper is filled into pores in the matrix of Mo particles having an average short diameter of about 3 μm. On the other hand, in the test pieces with the copper pool phases, the copper pool phases having an average particle size of about 100 μm are substantially uniformly dispersed in the same Mo—Cu based composite phase. As is clear from FIG. 4, it is understood that, even if the thermal conductivity is same, the thermal expansion coefficient is reduced by forming the copper pool phases. It is noted here that, as analyzed by the present inventors, the amount of reduction is at least $0.4 \times 10^{-6}/°$ C. or more in the region where the copper amount is 30 weight % or more and the amount of the copper pool phases is 10 weight % or more. If the thermal conductivity is replaced by the electroconductivity, the relationship with the thermal expansion coefficient exhibits the substantially same tendency.

Figure 5:
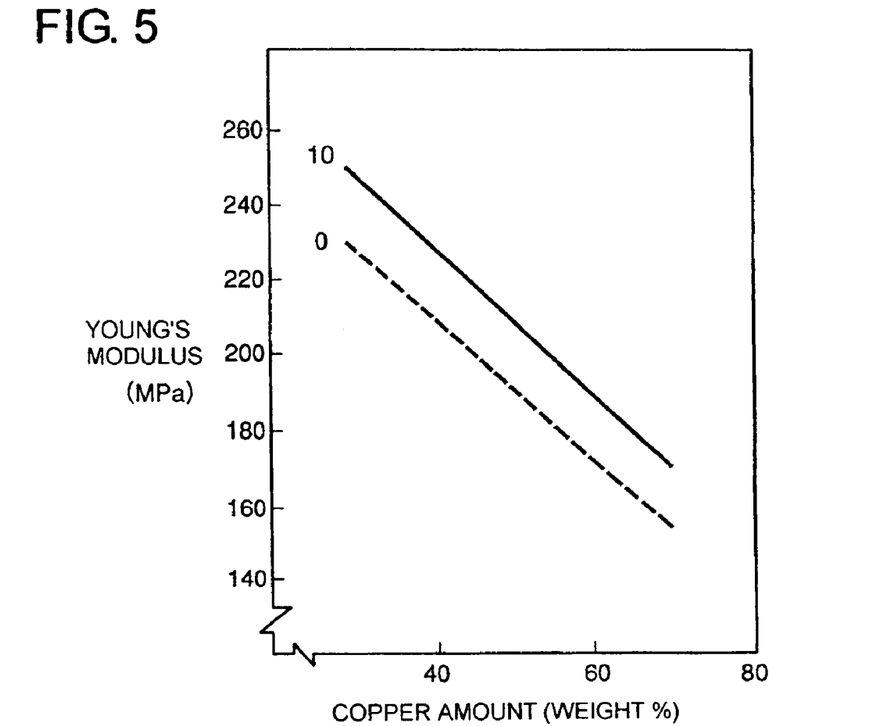
FIG. 5 is a view showing one example of the relationship between the copper amount of the composite material of the present invention and the Young's modulus.

Referring to FIG. 5, the Young's modulus was measured using these test pieces by the ultrasonic resonance method. Numerical values 0 and 10 at top ends of two lines represent the amounts (weight %) of the copper pool phases. A dotted line represents the case where no plastic deformation is conducted and the deformation degree is 0% while a solid line represents the case where plastic deformation is conducted at the deformation degree of 90% by warm rolling. Each test piece is cut off in such a manner that the direction perpendicular to the rolling direction of the raw materials is coincident with a load applying direction. The test pieces without the copper pool phases in FIG. 5 comprise only the Mo—Cu based composite phase in which copper is filled in pores in the matrix of Mo particles having an average particle size of about 3 μm. In the test pieces with copper pool phases, the copper pool phases having an average short diameter of about 100 μm are substantially uniformly dispersed, in an amount of 10 weight % in total, in the matrix of the same Mo—Cu based composite phase. In case of the material of the present invention having a copper amount of 70 weight % or less, the Young's modulus become large by an increase in amount of the copper pool phases even if the copper amount is same, although not illustrated in FIG. 5. It is understood from FIG. 5 that, in case where the copper pool phases are formed, the Young's modulus is higher by at least 15 MPa or more, that is, 10% or more than that in case where no copper pool phases are formed, even if the copper amount is same. This phenomenon is observed also in case where another copper alloy such as chromium copper is used, and is supposed to affect a decrease in thermal expansion coefficient described above. Although not confirmed yet, it is supposed that such a phenomenon is caused because, in the composite material of the present invention, the amount of Mo in the Mo—Cu based composite phase forming the matrix is relatively large as compared with the material which has the same total copper amount but comprises only the Mo—Cu based composite phase without the copper pool phases.

In the composite material of this type, the level of the thermal expansion coefficient in the thickness direction is varied depending on the copper amount and, as described above, is also varied depending upon the degree of the plastic deformation.

Figure 6:
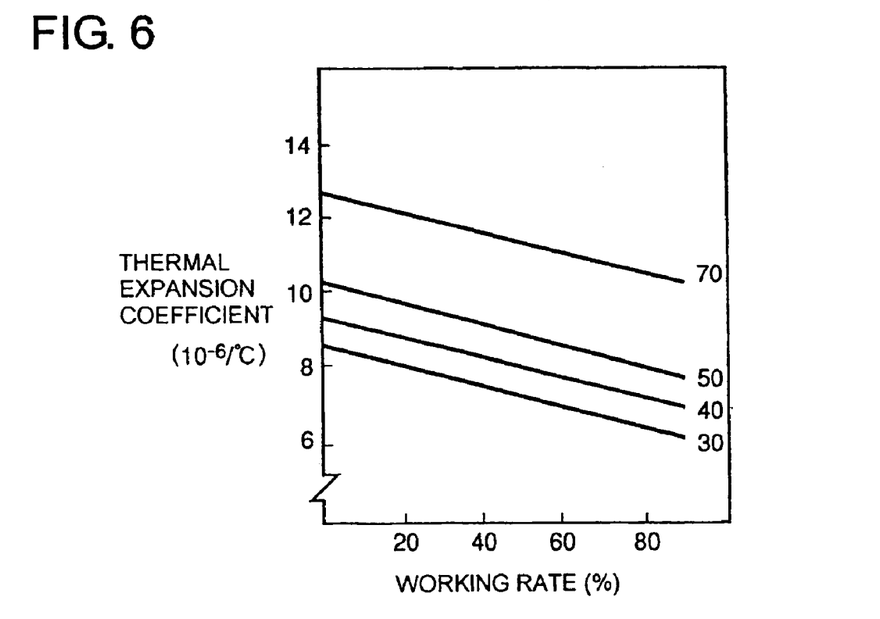
FIG. 6 is a view showing the relationship between the thermal expansion coefficient of the composite material of the present invention prepared under the conditions substantially same as those in case of FIG. 4 and the degree of plastic deformation.

FIG. 6 is a view showing the relationship between the thermal expansion coefficient of the material of the present invention prepared under the conditions substantially same as those in case of FIG. 4 and the degree of plastic deformation thereof. Numerical values at right ends of lines in FIG. 6 represent the copper amounts (weight %). It is understood from the slopes of the lines in FIG. 6 that the thermal expansion coefficient in the thickness direction is decreased by at least $0.2 \times 10^{-6}/°$ C. corresponding to every 10% increase in deformation degree.

FIGS. 7A to 7(g) are views which schematically illustrate examples of the arrangement pattern of the copper pool phases and the Mo—Cu based composite phase in the composite material of the present invention. In FIGS. 7(a) to 7(g), black regions represent the copper pool phases and a white region represents the matrix of the Mo—Cu based composite phase. The pattern may be designed in the viewing field as shown in FIG. 3, that is, in a microscopic scale, may be designed in the scale of a material or a member, that is, in a macroscopic scale, or may be designed based on an intermediate concept as a combination or mixture thereof. Design factors include component species of the composite material and the morphology of each of the copper pool phases and the Mo—Cu based composite phase. For example, the component species of the composite material include components of the copper-based material, such as pure copper and a copper alloy, Mo, and other components added thereto. The morphology of the copper pool phases includes the size and the shape thereof, the arrangement interval therebetween, and the arrangement density per unit volume of the composite material. The morphology of the Mo—Cu based composite phase includes the size of Mo particles and the distribution thereof. By combining a plurality of the above-mentioned factors to one another, it is possible to obtain a composite material which can have fine functional variations within the scope of physical properties peculiar to the component species and physical properties as combinations thereof, as well as various applied members using the composite material.

Figure 7:
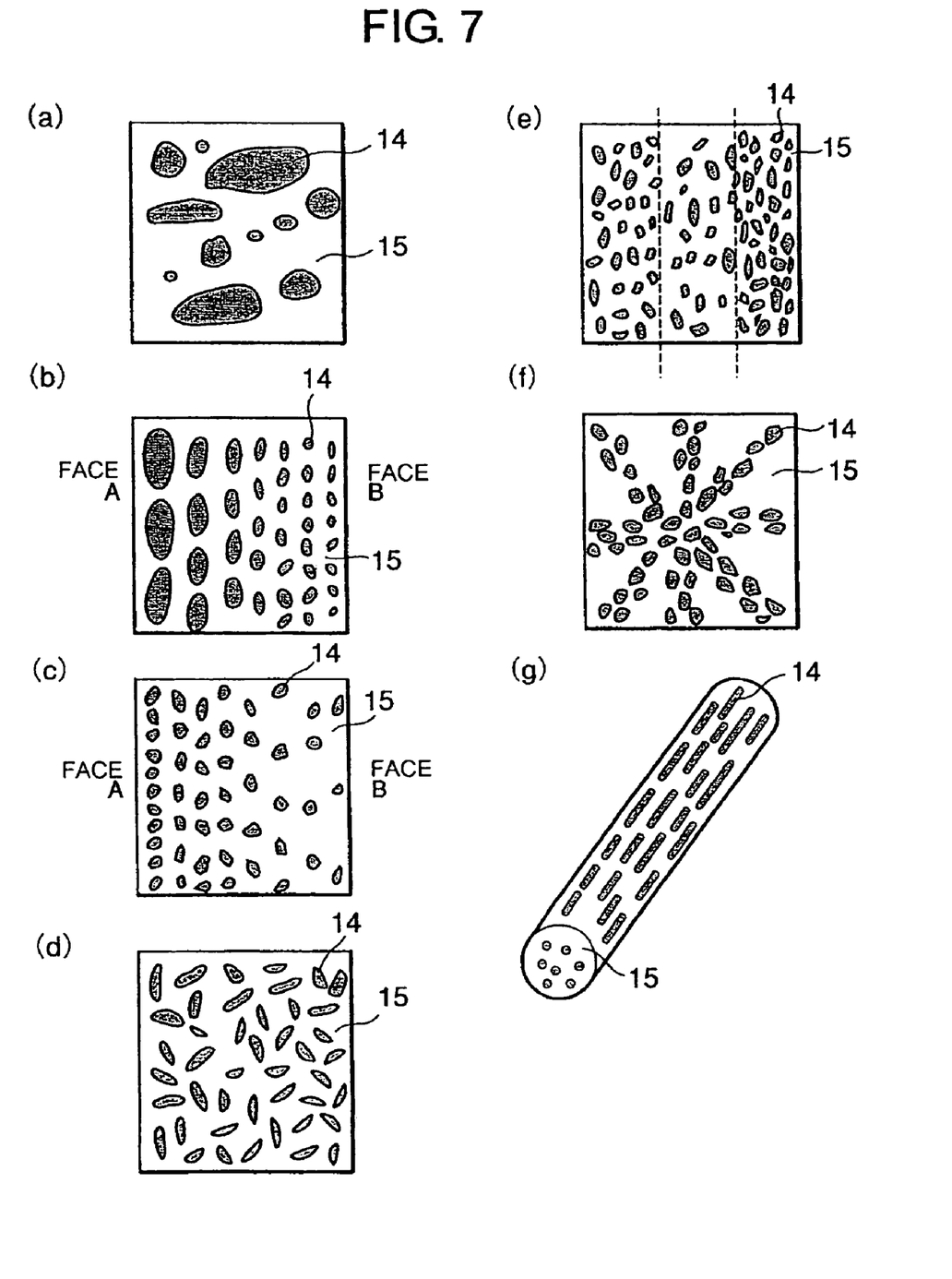

FIG. 7 (a) is a view which illustrates, in a microscopic viewing field, a case where the copper pool phases of a plurality of different sizes are microscopically mixed. If the whole of the composite material is arranged in this manner, the material additionally has performances obtained in absence of the copper pool phases, in contrast to the case where the copper pool phases of the substantially same size are arranged. If the above-mentioned arrangement is combined with morphologic factors of the Mo—Cu based composite phase, such as the size and the distribution of Mo particles, it is possible to obtain various materials having wider variety of functions within the similar function scope.

FIGS. 7 (b) and 7 (c) show examples where the copper pool phases are arranged in a functionally gradient design. FIG. 7 (b) is a view which illustrates, in a macroscopic viewing field, a case where the copper pool phases different in size are arranged in decreasing order of size substantially continuously from a face A toward another face B. The sizes may be intermittently reduced. FIG. 7 (c) is a view which illustrates, in a macroscopic viewing field, a case where the copper pool phases of the same size are arranged at arrangement intervals stepwise or continuously changed from a face A toward another face B. The intervals may be intermittently changed. The factors for the arrangement of the functionally gradient design include other many factors such as the component species, the weight ratio, the starting point and the direction of the gradient, and so on. With the above-mentioned arrangement, it is possible to obtain an integral member different in thermal expansion coefficient, for example, between front and back or between the center and the periphery and to easily adhere ceramics having a small thermal expansion coefficient to one part of the member and a metal having a large thermal expansion coefficient to the other part thereof without any trouble such as warp. In this case also, by combining the morphologic factors of the Mo—Cu based composite phase, it is possible to obtain functional materials having a wider variety of function levels.

FIG. 7 (d) is a view which illustrates, in a microscopic viewing field, a case where copper pool phases having a spindle-like shape are arranged in random directions. In case of adopting the arrangement having directivity throughout the entire material, a copper-based material having the shape of the type may be preliminarily arranged in a predetermined direction and then compressed. Alternatively, the above-mentioned arrangement may be obtained by arranging a copper-based material having an ordinary shape such a spherical or an elliptical shape, infiltrating copper, and then conducting plastic deformation. In this manner, directivity is obtained and fine adjustment of the functions can easily be attained. For this reason, the composite material can be used in wider applications such as electric contacts, spots, resistance welding, electric discharge machining, heat-sink members, and mechanical members.

FIG. 7 (e) is a view which schematically illustrates, in a macroscopic viewing field, a member composed of three layers different in arrangement density of copper pool phases. In FIG. 7 (e), dotted lines show boundaries between the layers. This material may be obtained, for example, by extruding and press-bonding green sheets of three layers, punching out a resultant laminate, sintering the laminate, and infiltrating copper. In this case, the material may be modified so as to have a higher continuity. In the above-mentioned manner, it possible to obtain a member having the substantially same functions as the above-mentioned members shown in FIGS. 7 (b) and 7 (c). Although not illustrated in the figure, it is also possible to obtain a member having two function level regions by the use of Mo particles different in particle size distribution. For example, the center region having the first function comprises only Mo particles having a narrow distribution width and small diameters, thereby increasing the porosity and the amount of infiltrated copper filled therein. The peripheral region having the second function is formed in the state where Mo particles having large diameters are added, thereby decreasing the porosity and the amount of infiltrated copper filled therein. In the resultant member, the central region including a large amount of copper has a high heat-radiating property while the peripheral region having a small amount of copper has a low thermal expansion characteristic. With this structure, it possible to easily provide an integral composite member suitable, for example, for a heat-sink member in which a semiconductor chip applied with a high heat load is arranged in the center region and an envelope member, such as ceramics, having a low thermal expansion characteristic, is arranged in the peripheral region.

FIG. 7 (f) and the subsequent figure schematically illustrate, in a macroscopic viewing field, other examples of the arrangement pattern. FIG. 7 (f) shows a case where regions higher in arrangement density of the copper pool phases are radially formed in the plane direction and these regions may serve as main passages for heat or electric current, buffer passages mainly buffering mechanical strain, or the like. These regions may be formed in only one surface portion or may be formed to reach the rear side. The morphology thereof may be varied depending on the intended use.

FIG. 7 (g) is a conceptual perspective view of a case where rod-like copper pool phases are oriented in a longitudinal direction of a rod-like member. In this case also, various modifications are conceivable.

As described above, the composite material of the present invention can be used not only as the heat-sink member to which such material has traditionally been used but also in a very wide variety of applications, for example, members for electric conduction, electric discharge machining, welding, electric bonding, a chemical equipment, and a mechanical part, by using the arrangement pattern obtained by skillfully combining presence or absence of the copper pool phases and the arrangement density thereof in two-dimensional directions or three-dimensional directions. Depending upon the design, a plurality of or different types of functions may be simultaneously incorporated into a single member, for example, one region as a heat-radiating part and another region as a mechanical part. Furthermore, by combining the morphologic factors of the Mo—Cu based composite phase or by adopting surface treatment or hybridization with other functional materials, in addition to the copper pool phases, the scope of application is further widened.

Now, specific examples of the present invention will be described.

EXAMPLE 1

A raw material of copper or a copper alloy shown in Table 1, which had a purity of 99% or more, and Mo powders shown in Table 2 were prepared.

From the copper-based materials in Table 1 and the Mo powders in Table 2, various combinations in Tables 3 to 5 were selected. At the ratio shown in the tables and using the means described in the following, the copper-based material was arranged in the matrix of the Mo powder at substantially uniform intervals and then compressed. In Tables 3 to 5, each sample with a symbol * affixed on the left is a sample as a comparative example. In each of samples Nos. 1 to 8, a powder was obtained by mixing 1% camphor by weight ratio with respect to 100 of the Mo powder of the material No. 13 with alcohol used as a medium, and pressing and then crushing the compressed body.

TABLE 1

| Material No. | Material | Material Morphology | Average Short Diameter (μm) | Average Long Diameter (μm) |
|---|---|---|---|---|
| 1 | electrolytic copper | secondary particles formed by aggregation of spherical primary particles | 40 | 80 |
| 2 | electrolytic copper | secondary particles formed by aggregation of spherical primary particles | 50 | 150 |
| 3 | electrolytic copper | secondary particles formed by aggregation of spherical primary particles | 70 | 160 |
| 4 | electrolytic copper | secondary particles formed by aggregation of spherical primary particles | 100 | 220 |
| 5 | electrolytic copper | secondary particles formed by aggregation of spherical primary particles | 180 | 340 |
| 6 | electrolytic copper | secondary particles formed by aggregation of spherical primary particles | 200 | 400 |
| 7 | electrolytic copper | secondary particles formed by aggregation of spherical primary particles | 250 | 430 |
| 8 | electrolytic copper | secondary particles formed by aggregation of spherical primary particles | 270 | 450 |
| 9 | oxygen-free copper | spherical powder | 100 | 100 |
| 10 | chromium-copper | " | 100 | 150 |

Notes)
The average particle size of the secondary particles is the diameter in the short axis direction of the external shape of aggregation of the primary particles.

Notes) The average particle size of the secondary particles is the diameter in the short axis direction of the external shape of aggregation of the primary particles.

TABLE 2

| Material No. | Material | Material Morphology | Average Particle Size (μm) |
|---|---|---|---|
| 11 | Mo | secondary particles formed by aggregation of spherical primary particles | 0.8 |
| 12 | " | secondary particles formed by aggregation of spherical primary particles | 1.5 |

TABLE 2-continued

| Material No. | Material | Material Morphology | Average Particle Size (μm) |
|---|---|---|---|
| 13 | " | secondary particles formed by aggregation of spherical primary particles | 3 |

Notes) The average particle size of the secondary particles is the diameter of the external shape of aggregation of the primary particles.

Powders of samples Nos. 9 to 35 were prepared as follows.

In each of the samples Nos. 9 to 34, the Mo powder of the material No. 13 was mixed, as it was, with each copper-based material at the ratio in the tables using a V type mixer to prepare a mixture.

In the sample No. 35, Ni powder having an average particle size of 2 μm was added at 1% by weight ratio with respect to 100 of the Mo powder of the material No. 13 and then the powders were preliminarily mixed and milled by a ball mill comprising a stainless ball and a pot and vacuum-dried. The resultant Mo powder and each copper-based material were mixed at a ratio shown in the table by a V type mixer to prepare a mixture. In this manner, the copper-based material was substantially uniformly dispersed and arranged in the Mo powder while the initial shape of the copper-based material was substantially maintained. Thereafter, 1% camphor by weight ratio was mixed with 100 of each of these powders with alcohol used as a medium, and then the compressed body of the mixture was granulated by pressing and crushing. Thus, the powders were obtained.

Each of the powders of the samples Nos. 1 to 35 prepared as described above was filled in a mold at room temperature, and then compressed at a pressure up to 5 ton/cm$^2$. Thereafter, the binder was removed at 400° C. in a nitrogen gas flow. Each sample with a symbol # was further pre-sintered at 800 to 1400° C. in a hydrogen atmosphere in order to adjust the porosity. From the external dimensions and the weight of each compressed body or each pre-sintered body, the porosity thereof was calculated.

The values are shown in the column "porosity of compressed body" in each of Tables 3 to 5. Next, the copper materials same as those preliminarily mixed initially were used to prepare a copper-based infiltrating material corresponding to the porosity. The infiltrating material was put on or under the compressed body or the pre-sintered body and held in the hydrogen gas atmosphere at 1200° C. for 2 hours. Thus, the copper-based infiltrating material same as the used copper material was infiltrated.

In each of the samples Nos. 36 and 37, the compressing step was performed by extrusion molding and injection molding, respectively. In each case, the Mo powder of the material No. 11 and the copper-based material of the material No. 4 were prepared. The Mo powder and the copper-based material were weighed so that the former is 80% and the latter is 20 weight %. Then, the powders were preliminarily mixed in a V type mixer in the manner similar to that described above.

For the powder of the sample No. 36, a polyvinyl acetate aqueous solution containing a plasticizer was added at 5% by volume ratio of solid contents with respect to 100 of the above-mentioned powder, kneaded, and extruded in a rectangular cross section. A resultant product was cut to prepare a compressed body.

For the powder of the sample No. 37, polyethylene containing a plasticizer was added at 30% by volume ratio with respect to 100 of the above-mentioned powder, heated and kneaded, and subjected to hot injection-molding into a notebook-like shape having a rectangular cross section. A resultant product was cut off to prepare a compressed body. Thereafter, these molded bodies were heated in vacuum. For the former and the latter, solid contents were removed at 400° C. and at 600° C., respectively. Furthermore, pre-sintering was performed at 1200° C. in hydrogen to obtain a pre-sintered body having a porosity shown in Table 3 below. Thereafter, under the same conditions as samples Nos. 1 to 34, the copper based infiltrating material was infiltrated.

In the sample No. 38, the steps up to infiltration were performed under the conditions same as those in the sample No. 15 except that the material No. 9 was used as the copper-based material.

TABLE 3

| | combination and mixing ratio (weight %) | | | | porosity |
|---|---|---|---|---|---|
| | copper material | | Mo powder | | of compressed body |
| sample No. | material No. | mixing ratio | material No. | mixing ratio | or pre-sintered body (%) |
| *1 | — | 0 | 13 | 100 | #28 |
| *2 | — | 0 | 13 | 100 | #32 |
| *3 | — | 0 | 13 | 100 | 37 |
| *4 | — | 0 | 13 | 100 | 42 |
| *5 | — | 0 | 13 | 100 | 52 |
| *6 | — | 0 | 13 | 100 | 62 |
| *7 | — | 0 | 13 | 100 | 73 |
| *8 | — | 0 | 13 | 100 | 78 |
| *9 | 4 | 10 | 13 | 90 | #17 |
| 10 | 4 | 10 | 13 | 90 | #33 |
| 11 | 4 | 10 | 13 | 90 | #28 |
| 12 | 4 | 10 | 13 | 90 | #33 |
| 13 | 4 | 20 | 13 | 80 | #33 |
| 14 | 4 | 20 | 13 | 80 | 43 |
| 15 | 4 | 30 | 13 | 70 | 43 |
| *16 | 4 | 30 | 13 | 70 | 48 |
| *17 | 4 | 8 | 13 | 92 | 45 |
| 18 | 4 | 10 | 13 | 90 | 42 |
| 19 | 4 | 30 | 13 | 70 | #21 |
| 20 | 4 | 30 | 13 | 70 | #32 |
| 21 | 4 | 40 | 13 | 60 | #20 |
| 22 | 4 | 20 | 13 | 80 | 51 |
| 23 | 4 | 40 | 13 | 60 | #30 |
| 24 | 4 | 50 | 13 | 50 | #20 |
| *25 | 4 | 55 | 13 | 45 | #15 |
| 26 | 1 | 20 | 13 | 80 | #22 |
| 27 | 2 | 20 | 13 | 80 | #22 |
| 28 | 4 | 20 | 13 | 80 | #22 |
| 29 | 6 | 20 | 13 | 80 | #22 |
| 30 | 7 | 20 | 13 | 80 | #22 |
| 31 | 8 | 20 | 13 | 80 | #31 |
| 32 | 5 | 20 | 13 | 80 | #31 |
| 33 | 3 | 20 | 13 | 80 | 41 |
| 34 | 5 | 20 | 13 | 80 | 41 |
| 35 | 4 | 20 | 13 | 80 | #40 |
| 36 | 4 | 20 | 11 | 80 | #41 |
| 37 | 4 | 20 | 11 | 80 | #41 |
| 38 | 9 | 30 | 13 | 70 | #43 |
| 39 | chromium-copper | 20 | 13 | 80 | #42 |
| *40 | chromium-copper | 0 | 13 | 100 | #61 |

TABLE 4

| | infiltrated body | | | | |
|---|---|---|---|---|---|
| | copper amount (weight %) | | relative density (%) | thermal conductivity (W/mk) in thickness direction | thermal expansion coefficient ($10^{-6}$/° C.) in thickness direction |
| sample No. | entire copper | copper pool phases | | | |
| *1 | 24 | 0 | 98 | 210 | 8.0 |
| *2 | 31 | 0 | 99 | 228 | 9.1 |
| *3 | 34 | 0 | 99 | 238 | 9.7 |
| *4 | 41 | 0 | 99 | 248 | 10.3 |
| *5 | 49 | 0 | 99 | 273 | 11.5 |
| *6 | 59 | 0 | 99 | 300 | 13.0 |
| *7 | 69 | 0 | 99 | 310 | 13.5 |
| *8 | 74 | 0 | 98 | 320 | 14.0 |
| *9 | 24 | 10 | 98 | 215 | 7.9 |
| 10 | 30 | 10 | 99 | 229 | 8.7 |
| 11 | 35 | 10 | 99 | 273 | 9.0 |
| 12 | 40 | 10 | 99 | 245 | 9.5 |
| 13 | 49 | 19 | 99 | 270 | 10.1 |
| 14 | 59 | 19 | 99 | 290 | 11.0 |
| 15 | 69 | 30 | 99 | 318 | 11.3 |
| *16 | 74 | 29 | 99 | 335 | 12.4 |
| *17 | 49 | 9 | 98 | 273 | 11.0 |
| 18 | 49 | 11 | 99 | 272 | 10.9 |
| 19 | 49 | 30 | 99 | 268 | 9.5 |
| 20 | 59 | 30 | 99 | 293 | 10.3 |
| 21 | 60 | 39 | 99 | 287 | 9.8 |
| 22 | 69 | 21 | 98 | 320 | 12.6 |
| 23 | 70 | 39 | 98 | 310 | 10.8 |
| 24 | 69 | 49 | 99 | 315 | 10.6 |
| *25 | 71 | 56 | 99 | 317 | 10.2 |
| 26 | 39 | 21 | 99 | 236 | 9.3 |
| 27 | 40 | 20 | 99 | 238 | 9.3 |
| 28 | 39 | 21 | 99 | 240 | 9.3 |
| 29 | 39 | 19 | 99 | 242 | 9.3 |
| 30 | 39 | 19 | 99 | 243 | 9.3 |
| 31 | 49 | 20 | 99 | 272 | 10.2 |
| 32 | 50 | 19 | 99 | 274 | 10.1 |
| 33 | 60 | 19 | 98 | 286 | 12.3 |
| 34 | 59 | 20 | 99 | 286 | 12.3 |
| 35 | 60 | 21 | 99 | 248 | 12.1 |
| 36 | 60 | 19 | 99 | 280 | 12.0 |
| 37 | 59 | 20 | 99 | 283 | 11.9 |
| 38 | 69 | 29 | 99 | 360 | 11.0 |
| 39 | 59 | 29 | 98 | 220 | 12.0 |
| *40 | 59 | 0 | 98 | 223 | 12.9 |

TABLE 5

| | plastic-deformed body | | | |
|---|---|---|---|---|
| sample No. | working rate (%) | thermal conductivity (W/mk) in thickness direction | thermal expansion coefficient ($10^{-6}$/° C.) in thickness direction | Notes |
| *1 | 90 | 190 | 6.5 | no copper pool phases |
| *2 | 90 | 200 | 7.0 | " |
| *3 | 90 | 210 | 7.2 | " |
| *4 | 90 | 222 | 9.3 | " |
| *5 | 90 | 260 | 9.3 | " |
| *6 | 90 | 280 | 10.0 | " |
| *7 | 90 | 300 | 11.0 | " |
| *8 | 90 | 310 | 11.4 | " |
| *9 | 90 | 193 | 6.0 | total amount of copper |
| 10 | 90 | 200 | 6.2 | " |
| 11 | 90 | 214 | 6.6 | " |
| 12 | 90 | 222 | 7.0 | " |
| 13 | 90 | 265 | 7.6 | " |
| 14 | 90 | 286 | 8.6 | " |

TABLE 5-continued

| | | plastic-deformed body | | |
|---|---|---|---|---|
| sample No. | working rate (%) | thermal conductivity (W/mk) in thickness direction | thermal expansion coefficient ($10^{-6}/°$ C.) in thickness direction | Notes |
| 15 | 90 | 290 | 8.5 | " |
| *16 | 90 | 300 | 9.8 | " |
| *17 | 90 | 265 | 9.0 | amount of copper pool phases |
| 18 | 90 | 263 | 8.5 | amount of copper pool phases |
| 19 | 90 | 252 | 7.0 | amount of copper pool phases |
| 20 | 90 | 283 | 7.8 | amount of copper pool phases |
| 21 | 90 | 277 | 7.3 | amount of copper pool phases |
| 22 | 90 | 293 | 10.1 | amount of copper pool phases |
| 23 | 90 | 287 | 8.3 | amount of copper pool phases |
| 24 | 90 | 287 | 8.1 | amount of copper pool phases |
| *25 | 90 | 280 | 8.0 | amount of copper pool phases |
| 26 | 90 | 220 | 6.9 | copper-based material average particle size |
| 27 | 90 | 221 | 6.9 | copper-based material average particle size |
| 28 | 90 | 222 | 6.8 | copper-based material average particle size |
| 29 | 90 | 225 | 6.8 | copper-based material average particle size |
| 30 | 90 | 225 | 6.8 | copper-based material average particle size |
| 31 | 90 | 225 | 7.7 | copper-based material average particle size |
| 32 | 90 | 225 | 7.6 | copper-based material average particle size |
| 33 | 90 | 276 | 10.0 | copper-based material average particle size |
| 34 | 90 | 276 | 9.8 | copper-based material average particle size |
| 35 | 90 | 238 | 9.9 | copper-based material average particle size |
| 36 | 90 | 260 | 10.0 | Ni added |
| 37 | 90 | 258 | 9.9 | extrusion molding |
| 38 | 90 | 300 | 8.9 | injection molding |
| 39 | 90 | 190 | 10.0 | oxygen-free copper material |
| *40 | 90 | 188 | 10.9 | chromium copper extrusion molding |

Notes)
The average particle size of the secondary particles is the diameter of the external shape of aggregation of the primary particles.

The sample No. 39 was prepared as follows.

The copper-based material comprising chromium copper containing about 1 weight % Cr as the material No. 10 in Table 1 and the Mo powder of the material No. 13 in Table 2 were prepared. For the sample No. 39, 20 weight % of the copper-based material and 80 weight % of the Mo powder were mixed by a V type mixer. On the other hand, the starting material of the sample No. 40 was only the Mo powder. Next, a polyvinyl acetate aqueous solution containing a plasticizer was added at 5% by volume ratio to each powder and kneaded. Then, the mixture was extruded in a rectangular cross section. A resultant product was cut to prepare each compressed body. Each compressed body was heated at 400° C. in vacuum to remove the binder therein. Furthermore, each compressed body was pre-sintered at 1300° C. in hydrogen and then infiltrate chromium copper same as the copper-based material as the starting material at 1250° C. in hydrogen.

For each of all resultant infiltrated bodies, the outer periphery was removed by grinding. Thereafter, cutting chips were collected to analyze the contents of Cu, Mo, and impurities by emission spectro-photometric analysis. The amount of the copper pool phases was obtained by taking an optical micrograph of a polished sample section at 50 magnifications, image-processing the copper region in the viewing field, obtaining an area ratio of the regions corresponding to the copper pool phases, and then calculating the amount from the ratio and the analyzed total amount of copper. Table 3 shows the total amount of copper and the amount of the copper pool phases of each of the infiltrated bodies. The component amounts in each of the plastic-deformed bodies are equal to these values and are not listed in the table.

The relative density after infiltration in Table 4 is a ratio (%) of the actually measured density, which was analyzed by the underwater method (Archimedes' method), to the theoretical density calculated from the component analysis result of each sample. It was analyzed for all samples that the relative density was 100% after the plastic deformation. Methods of measuring and analyzing the thermal conductivity and the thermal expansion coefficient are same as those described above.

The plastic deformation of each infiltrated body was performed as follows. First, the outer peripheral portion of the infiltrated body of each sample was removed and a rectangular material was prepared. Thereafter, the material was hot-rolled in the temperature range of 150° C. to 300° C. at a deformation degree of 30 to 90%. By the use of the rolled sheet thus obtained, respective properties were analyzed in the manner similar to that described in connection with the infiltrated body.

The above-mentioned results are listed in Tables 3 to 5. Although the tables do not include the results for the Young's modulus, the data substantially coincident with the lines in FIG. 5 were analyzed for the samples Nos. 1 to 38, as described above in connection with FIG. 5. In the samples Nos. 39 and 40 also, those results substantially along the lines were analyzed. By MPa, No. 39 had a value of 145 MPa and No. 40 had a value of 130 MPa immediately after the infiltration, and No. 39 had a value of 160 MPa and No. 40 had a value of 145 MPa after the plastic deformation at a deformation degree of 10%. Although not shown in the tables also, the electric conductivity was analyzed for the test pieces used in the above-mentioned example by % IACS (determined by the eddy current method with respect to pure copper as 100%). As a result, it was confirmed that the composite material of the present invention with the copper pool phases is lowered in thermal expansion coefficient by about 5% and increased in Young's modulus by about 10% as compared with the material without the copper pool phases if these samples have the same electric conductivity.

EXAMPLE 2

Figure 8:
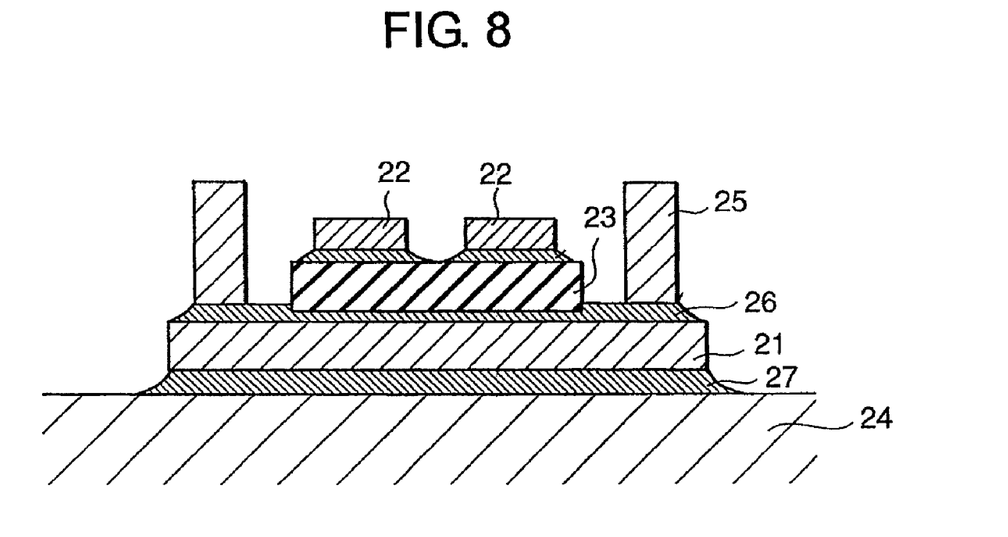
FIG. 8 is a schematic sectional view of a state where a heat-sink member of the present invention is fitted to a package for a semiconductor module.

Plate-like materials of 150 mm square and 5 mm thick were prepared with the same material compositions as samples Nos. 2, 5, 10, 14, 17, 18, 22, 24, 25, 29, 32, 33, and 38 to 40 in Tables 3 to 5. In each case, an infiltrated body and a plastic-deformed body obtained by plastic deformation of the infiltrated body at a deformation degree of 90%, both of which had the same size, were prepared. Both of upper and lower surfaces of each sample were subjected to nickel plating. Each sample was fitted to a package for a semiconductor module having a sectional structure illustrated in a schematic view of FIG. 8. Then, a thermal cycle test was carrier out. In FIG. 8, the reference numeral 21 represents an intermediate substrate made of the above-mentioned composite material of the present invention, the reference numeral 22 represents a silicon semiconductor device having a thermal expansion coefficient of about $4\times10^{-6}/°$ C., the reference numeral 23 represents an upper substrate made of aluminum nitride (AlN) based ceramics having a thermal expansion coefficient of about $4\times10^{-6}/°$ C., and the reference numeral 24 represents a base substrate made of copper having a thermal expansion coefficient of $17\times10^{-6}/°$ C. An envelope member 25 made of ceramics, a metal, or the like is connected onto the intermediate substrate 21 of the present invention via silver solder 26. The intermediate substrate 21 is connected to the base substrate 24 via silver-tin based solder 27 and further soldered to the envelope or peripheral member 25 by silver solder 26.

A program in a single thermal cycle includes holding at −50° C. for 15 minutes, heating for 30 minutes, and holding at 150° C. for 15 minutes. This cycle was repeated 2000 times while checking production of an output from the module and a damage thereof every 500 cycles. The results are shown in Table 6. Herein, the "damage" means, for example, a damage at a connected portion due to warp or the like. The samples of the same sample number before and after the plastic deformation are not separately indicated since no substantial difference exist therebetween. However, for the samples without the copper pool phases, the degree of final damage is slightly smaller after the plastic deformation. From this result, it is obvious that the material of the present invention is superior in practical use.

Further, preparation was made of test pieces which were same in total copper amount and copper pool phase amount as the samples Nos. 2, 5, 10 and 18, which had the same size as mentioned above, and which were given a functionally gradient characteristic in the thickness direction as shown in FIG. 7 (c). The test pieces were subjected to a thermal cycle test of 3000 cycles according to the cycle program same as that described above. At this time, for each of the test pieces, the functionally gradient arrangement of the copper pool phases was adjusted so that the thermal expansion coefficient was about $6\times10^{-6}/°$ C. on the side of an upper substrate and about $12\times10^{-6}/°$ C. on the side of a base substrate. In this case also, the samples of the same size before and after the plastic deformation were prepared in the manner similar to that mentioned above. Both of upper and lower surfaces of each test piece were subjected to nickel plating. In each of a first group including the samples Nos. 2 and 10 and a second group including the samples Nos. 5 and 18, the total copper amount was substantially same.

As a result of the test, unlike the above-mentioned case without the functionally gradient characteristic, the samples Nos. 2 and 5 underwent the test without any substantial reduction in output and any substantial damage up to 2000 cycles. However, before 2500 cycles, output reduction of 50% or more was caused resulting from peeling of the intermediate substrate from the upper substrate due to warp of the intermediate substrate. On the other hand, the samples Nos. 10 and 18 based on the composite material of the present invention with the copper pool phases could be maintained without any damage, although slight reduction of output was observed before 3000 cycles for the sample before the plastic deformation. For those samples after the plastic deformation, no substantial reduction of output was caused. The above-mentioned result demonstrates that, in the samples having the same functionally gradient arrangement design, the material of the present invention with the copper pool phases is excellent in thermal shock resistance.

The modules of the example of the present invention were subjected to the severe thermal cycle program. In addition, there is a large difference in thermal expansion coefficient between the intermediate substrate and the upper substrate made of ceramics having a high Young's modulus. Therefore, the intermediate substrate resistant against thermal strain between the substrates and having a high thermal conductivity is necessary. It is understood that the composite material of the present invention is suitable for the intermediate substrate.

Further, the composite material was mounted to various other semiconductor apparatuses which are subjected to a smaller thermal load during practical use than that of the present module. Then, the effect of formation of the copper pool phases was analyzed. As a result, it has been analyzed that the material of the present invention is superior in durability at the time of mounting or after packaging. The above-mentioned results demonstrate that the material of the present invention with the copper pool phases is more suitable as a member used in a semiconductor apparatus, such as a heat-sink member, as compared with the materials without the copper pool phases.

TABLE 6

| Sample No. | condition after thermal cycles | | | | Notes |
|---|---|---|---|---|---|
| | after 500 cycles | after 1000 cycles | after 1500 cycles | after 2000 cycles | |
| *2 | ○ | ○ | Δ | — | output reduction of about 30% after 1500 cycles |
| *5 | ○ | ○ | Δ | — | output reduction of about 40% after 1500 cycles |
| 10 | ○ | ○ | ○ | ○ | |
| 14 | ○ | ○ | ○ | ○ | |
| *17 | ○ | ○ | Δ | Δ | output reduction of about 40% after 2000 cycles, although not damaged |
| 18 | ○ | ○ | ○ | ○ | |
| 24 | ○ | ○ | ○ | ○ | |
| *25 | ○ | ○ | ○ | Δ | output reduction of about 40% after 2000 cycles |
| 26 | ○ | ○ | ○ | ○ | |
| 29 | ○ | ○ | ○ | ○ | |
| 32 | ○ | ○ | ○ | ○ | |
| 33 | ○ | ○ | ○ | Δ | output reduction of about 50% after 2000 cycles |
| 38 | ○ | ○ | ○ | ○ | |
| 39 | ○ | ○ | ○ | ○ | |
| *40 | ○ | ○ | Δ | — | output reduction of about 50% after 1500 cycles |

EXAMPLE 3

A pair of electrodes having a diameter of 5 mm and a thickness of 5 mm for spot welding were cut off from each of the materials of the samples Nos. 2 and 10 immediately after the infiltration. By the use of the electrodes, an electric contact having a diameter of 5 mm and a thickness of 1 mm was spot-welded to a cupper alloy. The electrodes were faced to each other and fixed to a conductive portion of a welding machine. The assembly of the electric contact comprises a base metal, a silver-solder thin film placed thereon, and the electric contact mainly made of silver and placed thereon. This assembly was put on the lower fixed electrode. The upper movable electrode was moved down to apply a load of 500 g to the assembly. Simultaneously, electric current was supplied for 3 seconds to melt the silver solder, followed by natural cooling. In the above-mentioned manner, spot welding was repeated. When the number of welded products exceeded 1000, the electrode wear was compared. As a result, the amount of wear in the sample No. 10 with the copper pool phases was about 60% of that of the sample No. 2 without the copper pool phases.

EXAMPLE 4

An electrode for electric discharge machining, having the diameter and the thickness both of which were equal to 10 mm, was cut off from each of the materials of the samples Nos. 2 and 10. By the use of this electrode, a blind hole having a diameter of about 10 mm and a depth of 3 mm was formed on one surface of a rod-like TiC—Co based cermet part having a diameter of 20 mm by electric discharge machining. This step was repeated while workpieces were replaced one after another. When the number of worked products exceeded 1000, the electrode wear was compared. As a result, the amount of wear in the sample No. 10 with the copper pool phases was about 70% of that of the sample No. 2 without the copper pool phases.

As thus far been described about the embodiment of the present invention, it will readily be understood that the present invention is not limited to the above-mentioned examples but may be modified in various manners.

INDUSTRIAL APPLICABILITY

The composite material according to the present invention is most suitable for electrical and electronic members, such as a heat-sink member and a structural member of the electrical or the electronic equipment, a member for a heat-radiating equipment, an electric contact, and an electrode for electric discharge machining or welding, and a member for a chemical equipment.

The invention claimed is:

1. A composite material, which is a Mo—Cu based composite material having a Cu content of 30 to 70 weight % and which comprises a Mo—Cu composite phase and at least one copper pool phase, said at least one copper pool phase being contained in an amount of 10 to 50 weight %, wherein said at least one copper pool phase has a grain size larger than molybdenum particles forming the Mo—Cu composite phase and an average short diameter of 50 to 200 μm.

2. The composite material according to claim 1, wherein said composite material is subjected to plastic deformation.

3. A member using the composite material according to any one of claims 1 and 2.

4. A heat-sink member using the composite material according to any one of claims 1 and 2.

5. A semiconductor apparatus using the heat-sink member according to claim 4.

6. A method of producing a composite material, comprising the step of compressing a matrix of Mo powder and a copper-based material having an average short diameter of 50 μm or more and arranged in said matrix to obtain a compressed body and, optionally, sintering said compressed body to obtain a pre-sintered body, and the step of infiltrating one of copper and a copper alloy into said compressed body or said pre-sintered body to produce a composite material having a Cu content of 30 to 70 weight % and containing 10-50 weight % of at least one copper pool phase.

7. The method according to claim 6, wherein the copper-based material is powder which has an average short diameter of 50 to 200 μm and which is mixed with said Mo powder before the compressing step.

* * * * *